(12) United States Patent
Shida

(10) Patent No.: US 6,410,964 B1
(45) Date of Patent: *Jun. 25, 2002

(54) SEMICONDUCTOR DEVICE CAPABLE OF PREVENTING GATE OXIDE FILM FROM DAMAGE BY PLASMA PROCESS AND METHOD OF MANUFACTURING THE SAME

(75) Inventor: Akira Shida, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/050,356

(22) Filed: Mar. 31, 1998

(51) Int. Cl.[7] .............................................. H01L 23/62
(52) U.S. Cl. ........................ 257/356; 257/357; 257/371
(58) Field of Search ................................ 257/356, 357, 257/371

(56) References Cited

U.S. PATENT DOCUMENTS 3,712,995 A * 1/1973 Steudel ....................... 207/202
4,720,737 A * 1/1988 Shirato ...................... 357/23.13
5,519,242 A * 5/1996 Avery ......................... 257/356
5,567,968 A * 10/1996 Tsuruta et al. ............... 257/356
5,828,119 A * 10/1998 Katsube ...................... 257/491

FOREIGN PATENT DOCUMENTS

| JP | 2-78230 | 3/1990 |
|---|---|---|
| JP | 5-291568 | 11/1993 |
| JP | 6-232360 | 8/1994 |

* cited by examiner

Primary Examiner—Sara Crane
(74) Attorney, Agent, or Firm—Sughrue Mion, PLLC

(57) ABSTRACT

In a semiconductor device having MOS transistors, protective elements are connected to gate electrodes 5-b and 5-c each of which is an independent gate electrode through the first aluminum layers 7-a and 7-d. The first aluminum layers 7-a and 7-d are the wiring layers of the lowest layer. The protective elements are constituted by a junction of N well 1 and $P^+$ diffused layer 3-f and a junction of P well 2 and $N^+$ diffused layer 4-f, and a junction of N well 1 and $P^+$ diffused layer 3-g and a junction of P well 2 and $N^+$ diffused layer 4-g.

9 Claims, 12 Drawing Sheets

SEMICONDUCTOR DEVICE CAPABLE OF PREVENTING GATE OXIDE FILM FROM DAMAGE BY PLASMA PROCESS AND METHOD OF MANUFACTURING THE SAME

BACKGROUND OF THE INVENTION

The present invention relates to a semiconductor device using MOS transistors and a method of manufacturing the semiconductor device, and more particularly to a semiconductor device having a structure for protecting gate oxide films thereof from surge and a method of manufacturing the semiconductor device.

Conventionally, in the MOS structure of the MOS transistor, when the surge is supplied directly, the gate oxide film is broken or the property of the film is degraded. Therefore, the transistors of input buffers and output buffers having the possibility that the surge is supplied directly from the outside of LSIs provided with electrostatic protective elements specifically. On the other hand, although the specific electrostatic protective device is not provided on the transistors of the internal circuits having no possibility that the surge from the outside is supplied directly, the PN diode formed in a drain diffused layer and a well region of the transistor of a preceding stage acts as a protective element.

In the interim, there are manufacturing processes using plasma, damage is given to the gate oxide film of the MOS transistor in this manufacturing process, whereby the reliability of the MOS transistor can be seriously affected. For example, in etching process of aluminum used as wiring, for the gate oxide film of the independent gate electrode to which no protective element is connected, an electric stress is applied at overetching. This electric charge causes the capture of charge in an interface between the gate oxide film and silicon and generation of interface energy levels, so that degradation of the reliability such as characteristic fluctuation of VT and Gm or the like and degradation of hot carrier device life time or the like are caused. Although the major portion of the characteristic fluctuation is recovered by hydrogen alloy in manufacturing process, a time period and temperature of the hydrogen alloy are limited to effects of an influence on wiring material such as stress migration. Accordingly, it becomes more difficult that the characteristic fluctuation of the MOS transistor caused by the plasma damage is recovered perfectly, as the damage becomes larger. Furthermore, since the neutral capture energy levels are left even after performing of hydrogen alloy, the degradation of the hot carrier device life time has become serious trouble points.

In the structure of the conventional semiconductor device, it is impossible to avoid the problem that the gate oxide film is damaged in the plasma process. In addition, since the number of wiring thereof tends to increase by growth of the LSIs in performance, the gate oxide film tends to be exposed to the plasma process. Moreover, it is the realities that an electric stress tends to be increased by forming or the like of etching and isolation between layers utilizing a high density plasma source due to micronization of wiring and improvement of planarization.

On the other hand, thinning the gate oxide film is essentially required for speeding up the MOS transistor. As a result, a new problem of breakdown of the oxide film during the plasma process is caused, since the characteristic fluctuation and degradation of reliability for the electric stress not only become more significant, but also intrinsic breakdown voltage of the gate oxide film reduces proportional to the thickness of the gate oxide film.

SUMMARY OF THE INVENTION

It is an object of this invention to provide a semiconductor device capable of preventing gate oxide film from damage by plasma process and a method of manufacturing the semiconductor device.

Other objects of this invention will become clear as the description proceeds.

According to an aspect of this invention, a semiconductor device and a method of manufacturing the semiconductor device are obtained as follows:

(1) A semiconductor device having MOS transistors, said device characterized in that protective elements are connected to the independent gate electrode through the wiring layer of the lowest layer.

(2) A semiconductor device according to the embodiment 1 characterized in that said wiring layer of the lowest layer is constituted by the gate electrode.

(3) A semiconductor device according to the embodiment 2 characterized in that said protective elements are constituted by the PN diodes comprising:
a second conduction type well in which a first conduction type MOS transistor is formed, and a first conduction type diffused layer region formed by impurity diffusion from said gate electrode within said second conduction type well.

(4) A semiconductor device according to any one of the embodiment 1 to the embodiment 3 characterized in that said protective elements are formed in only either region of the first or the second conduction type regions.

(5) A semiconductor device according to any one of the embodiment 2 to the embodiment 4 characterized in that said protective elements are formed directly below a lead gate electrode.

(6) A method for manufacturing the semiconductor device of any one of the embodiment 1 to the embodiment 5 characterized in that a process for forming said protective element has been completed at the point of the time that the formation of the source drain is completed.

DETAILED DESCRIPTION OF THE PREFERRED EMBODIMENT

Figure 1:
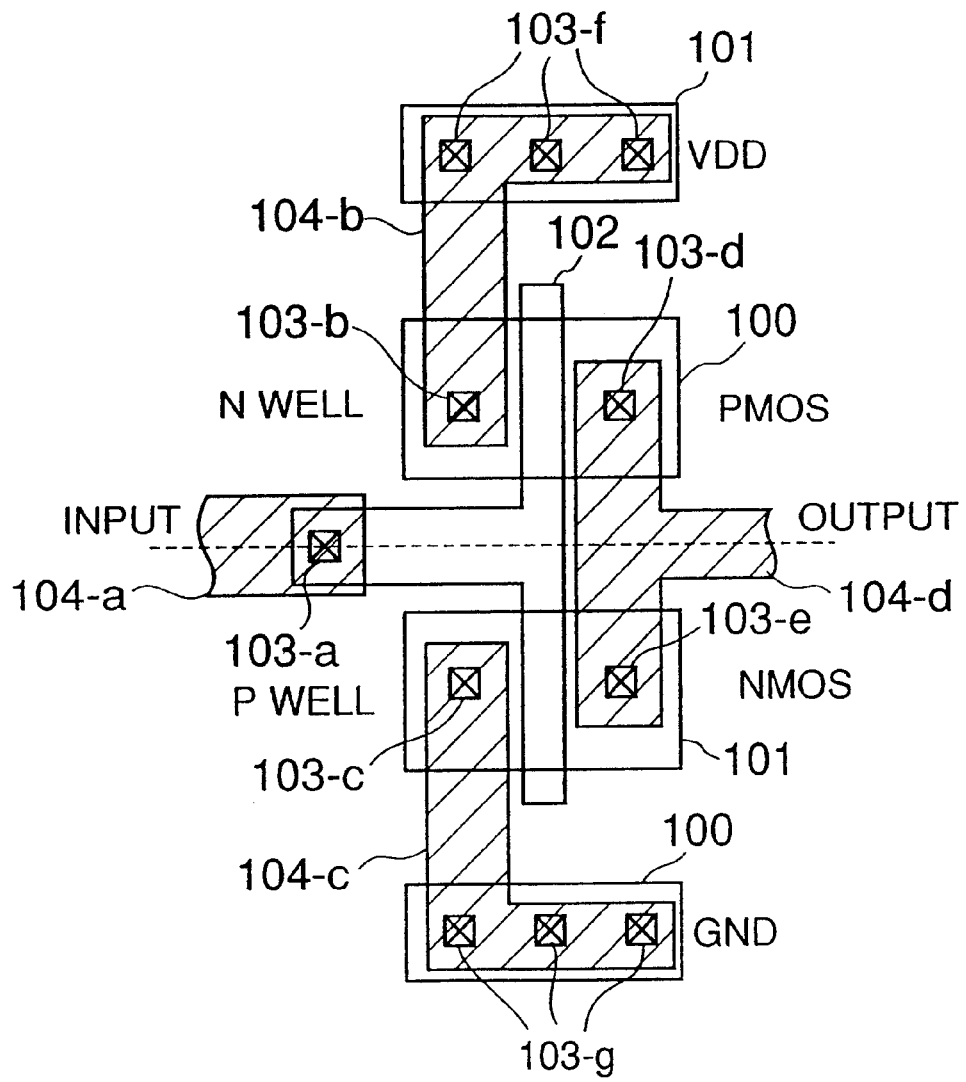
FIG. 1 is a layer view of a prior inverter circuit.
Figure 2:
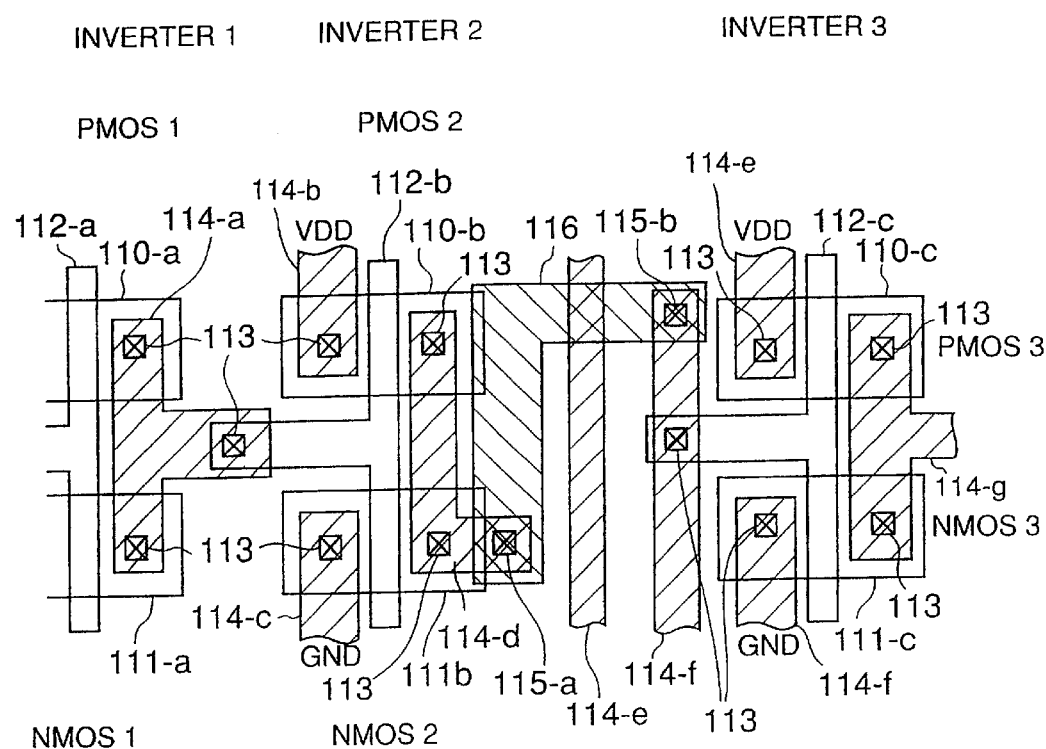
FIG. 2 is a layer view of one that three stages of the prior inverter are connected.
Figure 3:
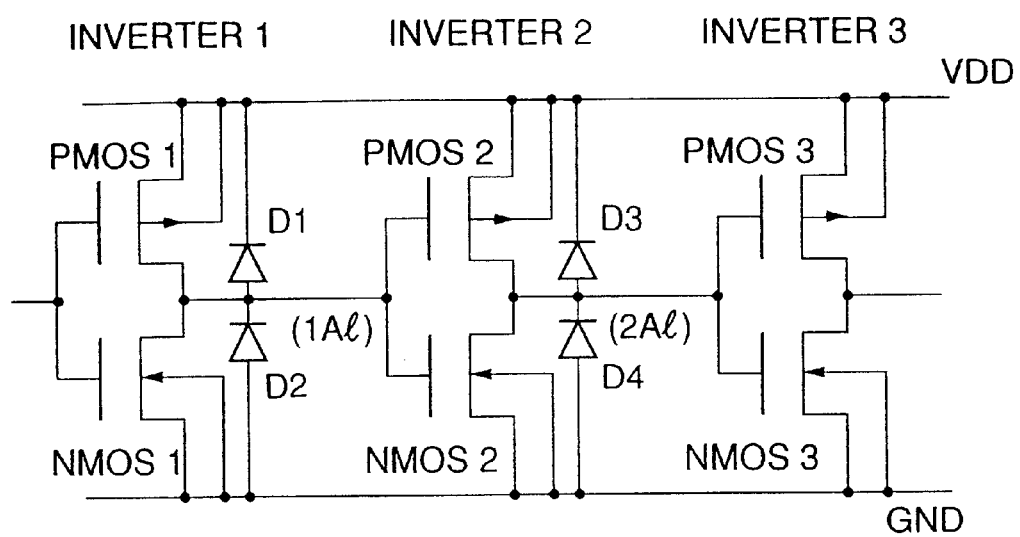
FIG. 3 is an equivalent circuit diagram of the layout shown in FIG. 2.

Referring to FIG. 1 to 3, description is, at first, made about a structure of a conventional semiconductor device for a better understanding of the present invention.

FIG. 1 is a view for showing a basic layout of an inverter circuit in previous CMOS type integrated circuit semiconductor devices. In FIG. 1, an input signal is transmitted from a first aluminum layer 104-*a* to a gate electrode 102 through a contact 103-*a*. On the other hand, an output of an inverter is transmitted from a first aluminum layer 104-*d* through a contact 103-*d* and 103-*e* from drain regions of an NMOS and a PMOS.

FIG. 2 is a modularized layout view of the case where three stages of the inverter circuits shown in FIG. 1 are connected. Moreover, in FIG. 2, a diffused layer for supplying voltage to an well and the well region are omitted. Moreover, a first inverter to a third inverter are shown as a inverter 1 to a inverter 3 in the Figure and a first NMOS to a third NMOS and a first PMOS to a third PMOS constituting each inverter respectively are shown as an NMOS 1 to an NMOS 3 and a PMOS 1 to a PMOS 3 in the Figure. An output of the first inverter is connected to a gate electrode 112-*b* of the second inverter by a first (aluminum layer 114-*a*. On the other hand, an output of the second inverter is connected to a gate electrode 112-*c* from a first aluminum layer 114-*d* through a second aluminum layer 116 and a first aluminum layer 114-*f*. The reason why the connection is performed through a second aluminum layer 116 is that the connection can not be performed through the first aluminum layer 114-*d* only since a first aluminum layer 114-*e* is interposed therebetween.

Thus, as mentioned in the preamble of the instant specification, in integrated circuits, the connection is frequently performed through a wiring layer of an upper layer to connect an output signal to an input of a subsequent stage due to constraints according to an layout. When a wiring length of connections becomes long, the wiring layer of the upper layer can be used intentionally since a wiring delay of a signal is reduced due to parasitic capacitance.

Incidentally, in the MOS structure of the MOS transistor, when the surge is supplied directly, the gate oxide film is broken or the property of the film is degraded. Therefore, the transistors of input buffers and output buffers having the possibility that the surge is supplied directly from the outside of LSIs provided with electrostatic protective elements specifically. On the other hand, although the specific electrostatic protective device is not provided on the transistors of the internal circuits having no possibility that the surge from the outside is supplied directly, the PN diode formed in a drain diffused layer and a well region of the transistor of a preceding stage acts as a protective element.

For example, an equipment circuit of FIG. 2 is shown in FIG. 3. For gate oxide films of a second NMOS and a second PMOS constituting a second inverter, drain junctions of a first NMOS and a first PMOS of a preceding stage act as protective diodes D1 and D2. For gate oxide films of a third NMOS 3 and a third PMOS constituting a third inverter, drain junctions of a second NMOS and a second PMOS of a preceding stage act as protective diodes D3 and D4, and these are connected through a second aluminum layer.

In the example of the previous structure shown in FIG. 2, there is a problem that the gate oxide films of a third NMOS and a third PMOS constituting a third inverter are damaged by overetching at patterning a first aluminum layer 114-*f* and overetching at opening a first through hole 115-*b*. The larger are a thickness and a wiring length of an aluminum film of the first aluminum layer 114-*f* or the more is the number of the first through hole 115-*b*, the larger becomes the degree of the damage. Moreover, although an usual overetching is required in order to prevent etching remaining caused by a micro-loading effect at etching and a pattern dependence, the larger is the amount of etching, the larger becomes the amount of the damage. Although the third inverter is connected to the transistor of the preceding stage by a second aluminum layer 116 in the drawing, the connection using a further upper wiring layer in wiring between function blocks and between macro cells is frequently performed, whereby there is the problem that the process exposed to the plasma damage are increased in response thereto.

As a means to avoid the aforementioned problems, when connecting all the transistor through the first aluminum layer as between the first inverter and second inverter of FIG. 2, there is no possibility of being exposed to the damage since protecting function acts for the plasma damage from after patterning of the first aluminum layer. However, since the layout is restrained significantly, so that high density integration is interfered, it is not a practical solution. Moreover, although the damage can be reduced by limitation of the wiring length of the first aluminum layer 114-*f* and the number of the first through hole, and thinning the thickness of the first aluminum layer, sacrifices from the viewpoint of the layout and performance are large and there are serious trouble points. Although reduction of the amount of overetching in the plasma process is effective also, the limitation is there, since there is a tradeoff between productivity and yield.

Hitherto, although the plasma damage in the wiring process is covered, the plasma damage is required to take into account with regard to the etching process at the gate electrode processing and etching at opening the contact holes also, except them. Even though connecting the transistor through the first aluminum layer of the lowest layer of the electrodes as between the first inverter and second inverter of FIG. 2, there is the problem that the gate oxide films are exposed to the plasma damage at overetching, since no protective element is connected when the gate electrode forming and opening the contact holes.

Figure 4:
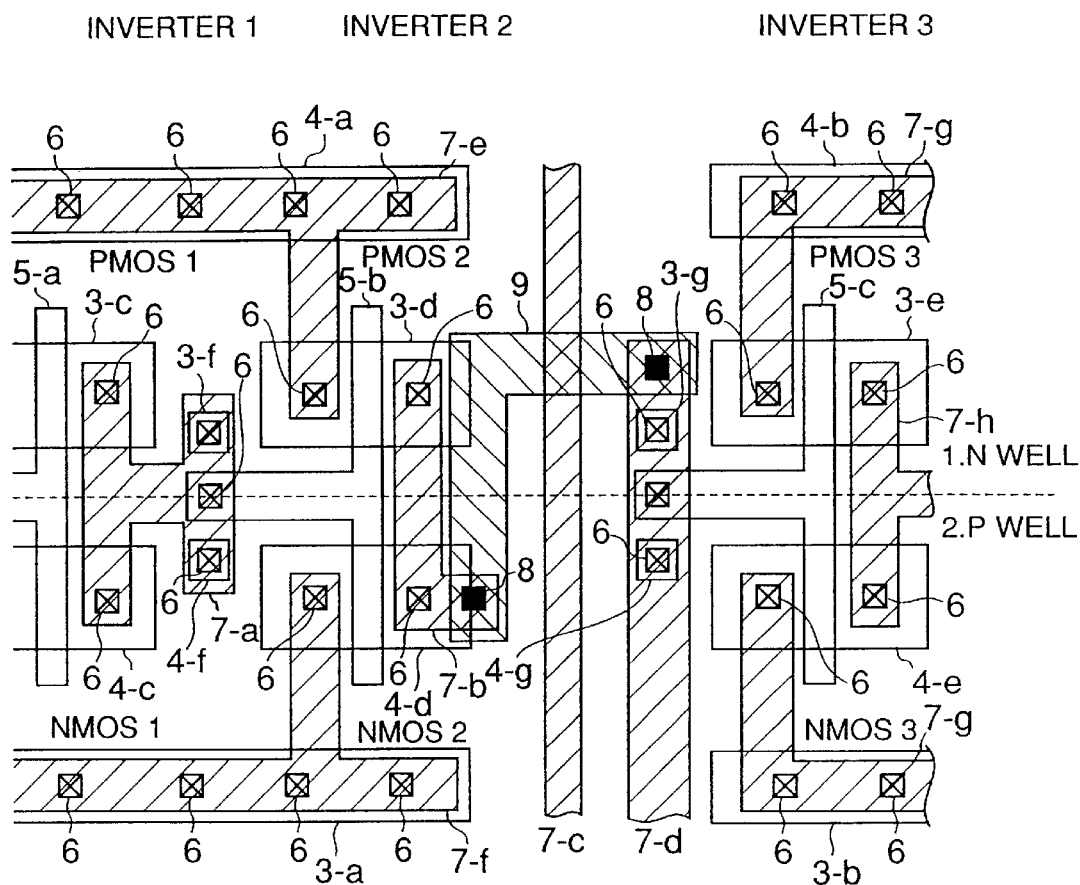
FIG. 4 is a layout view of an embodiment 1 according to the invention.
Figure 5:
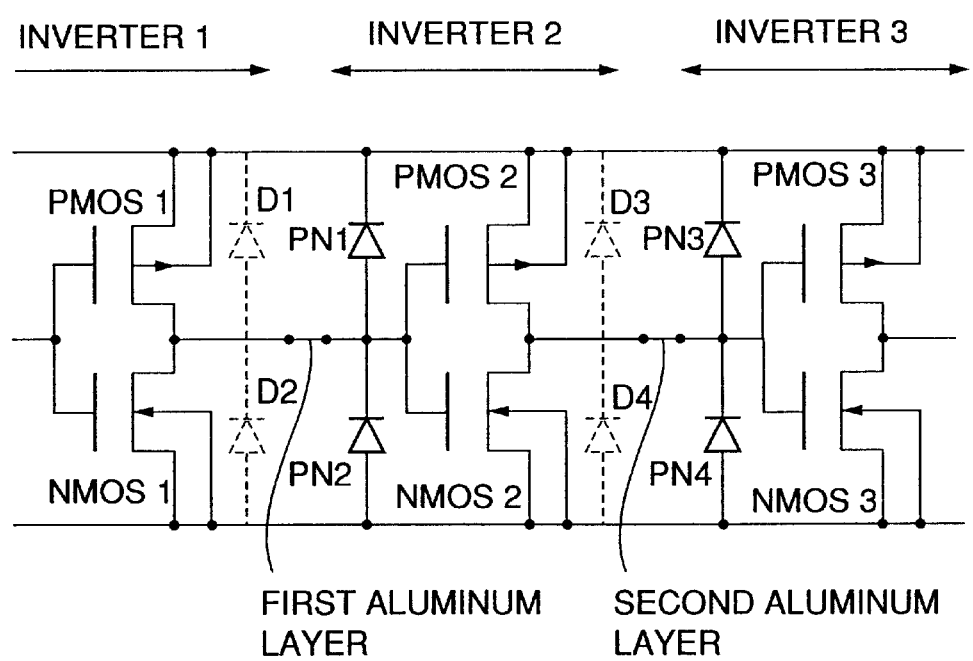
FIG. 5 is an equivalent circuit diagram of the layout shown in FIG. 4.

Now, referring to FIGS. 4 and 5, description will proceed to a semiconductor device according to a first embodiment of this invention.

Embodiment 1

FIG. 4 is a layer view of embodiment 1 according to the invention, and FIG. 5 is an equivalent circuit diagram thereof.

Referring to the FIGS. 4 and 5, a first, a second and a third inverter (referred to as inverter 1, 2 and 3 in the drawings) are connection in the stacked form, and an output of the first inverter and an input of the second inverter are connected through a first aluminum layer 7-*a*. An output of the second inverter and an input of the third inverter are connected from a first aluminum layer 7-*b* to a first aluminum layer 7-*d* through a second aluminum layer 9.

In a N well 1, a first, a second and a third PMOS (referred to as PMOS 1, 2 and 3 in the drawings) are formed. In a P well 2, a first, a second and a third NMOS (referred to as an NMOS 1, 2 and 3 in the drawings) are formed. Moreover, to the gate electrodes 5-*a* to 5-*c* of the entire transistors, the protective diodes are connected through the first aluminum layer.

In the gate electrode 5-*b* of second PMOS and the second NMOS, P⁺ diffused layer 3-*f* formed in the N well 1 and N⁺ diffused layer 4-*f* formed in the P well 2 become the protective diodes, and the PN 1 and the PN 2 shown in FIG. 5 correspond thereto. Moreover, in the gate electrode 5-*c* of the third PMOS and the third NMOS, P⁺ diffused layer 3-*g* formed in the N well 1 and N⁺ diffused layer 4-*g* formed in the P well 2 become the protective diodes, and a PN 3 and a PN 4 shown in FIG. 5 correspond thereto.

In such structure, since charge generating in the plasma process from after etching of the first aluminum layer escape to the silicon substrate through the protective diodes, whereby the charge is not accumulated not to become the electric stress to the gate oxide film, as is previous. For example, when positive charge is supplied to a first aluminum layer 7-*d* at over etching of the first aluminum layer, the protective diodes PN 3 being biased in forward direction acts to allow the charge to escape from P+ diffused layer 3-*g* to the N well 1. Moreover, even though the protective diodes PN3 is not connected, the protective diodes PN 4 acts to allow the charge to escape to the P well 2 by reverse direction current of the PN diode of which impedance is lower than MOS diode.

Since the aforementioned structure is realized by only adding the protective diodes being formed between the diffused layer and the well to the previous structure, an addition of a new process is not required.

Embodiments 2

Referring to FIGS. 6 to 10, description is made as regards a semiconductor device and a method of manufacturing the semiconductor device according to a second embodiment of this invention.

Figure 6:
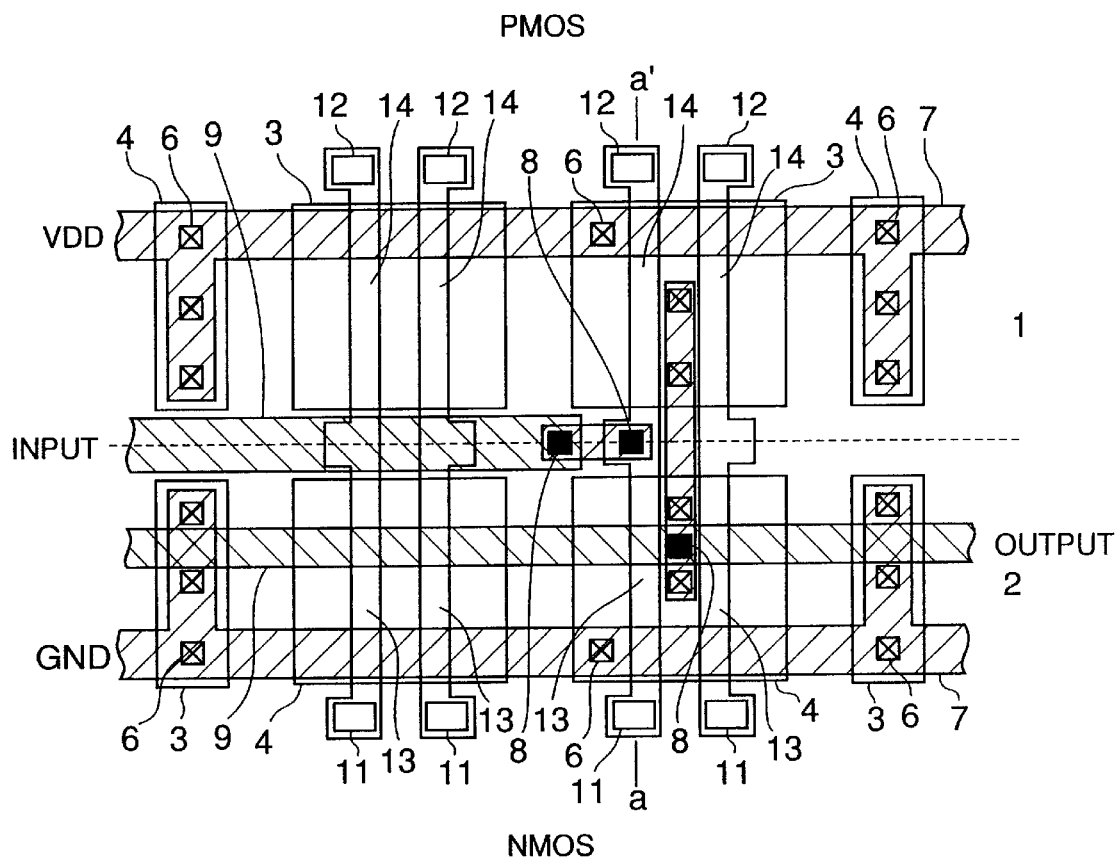
FIG. 6 is a layout view of an embodiment 2 according to the invention.
Figure 7:
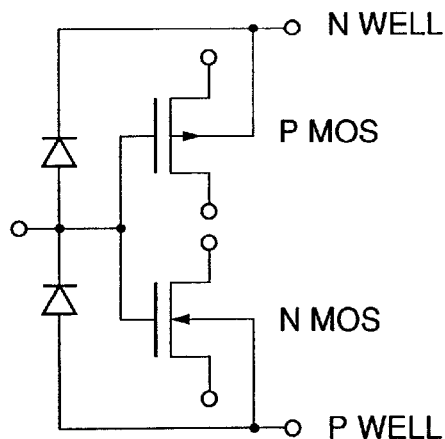
FIG. 7 is an equivalent circuit diagram of the layout shown in FIG. 6.
Figure 8:
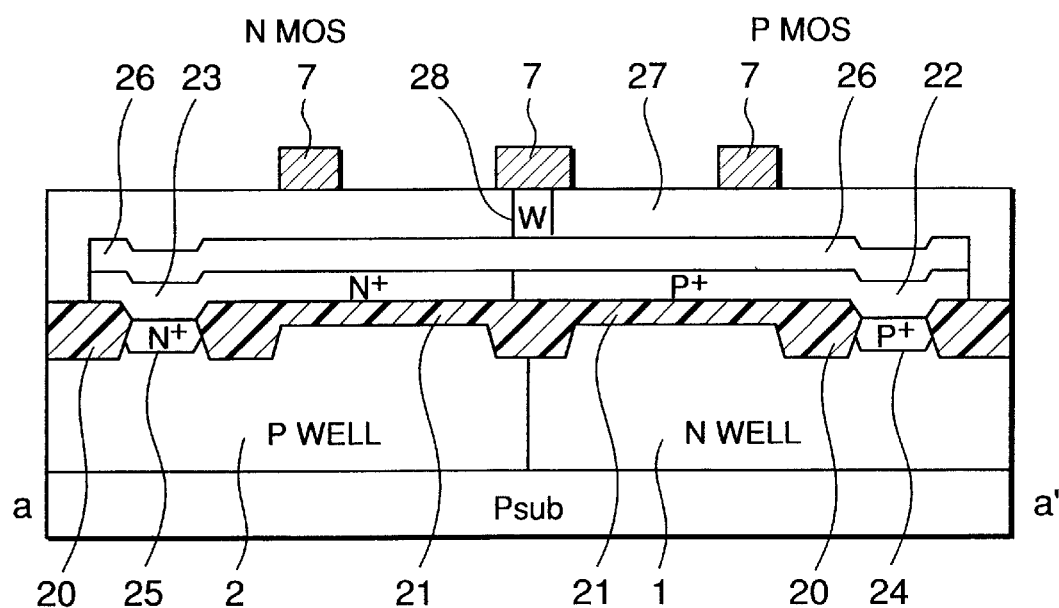
FIG. 8 is a sectional structure view (up to a first aluminum layer) of the embodiment 2 according to the invention.

FIG. 6 is a modularized layout view of a basic cell of a gate array. FIG. 7 is an equivalent circuit diagram of a basic transistor and FIG. 8 is a structural view taken through the section a-a' of FIG. 6. Moreover, in these drawings, the same portions or similar portions as the embodiment 1 are identified by the same reference symbols as FIG. 4 and FIG. 5.

Referring to the FIG. 6 to FIG. 8, in the N well 1, the PMOS transistor and N⁺ diffused layer. 4 for supplying well potential (VDD) are provided. In the P well 2, the NMOS transistor and P⁺ diffused layer 3 for supplying the well potential (GND) are provided.

A gate electrode 14 and 13 is formed across the PMOS and the NMOS. That is, the gate electrode is constituted by a double layers structure of P⁺ polycrystal silicon 22 and metal silicide 26 on the PMOS transistor as shown in FIG. 8. Moreover, the gate electrode is constituted by a double layers structure of N⁺ polycrystal silicon 23 and metal silicide 26 on the NMOS transistor.

In FIG. 8, for example, Ti silicide or Co silicide is used as metal silicide 26. Moreover, the gate electrode 13 and 14 (FIG. 6) is contact with silicon through a direct contact 11 and 12 (FIG. 6). Moreover, in the region of the direct contact 11 (FIG. 6), N⁺ diffused region 26 formed by impurity diffusion from N⁺ polycrystal silicon 28 and the P well 2 form a PN junction. Moreover, in the region of the direct contact 12 (FIG. 6), P⁺ diffused region 24 formed by impurity diffusion from P⁺ polycrystal silicon 22 and the N well 1 form the PN junction. Thus, in all the independent gate electrode, the PN diode for the N well 1 and the P well 2 through the direct contact 11 and 12 is formed. FIG. 7 is the drawing that shows this structure with an equivalent circuit, and this structure can be formed and incorporated at the step forming a ground of the gate array.

Subsequently, referring to FIGS. 9A to 9C and FIGS. 10A and 10B, a method for manufacturing the semiconductor device according to the embodiment 2 is described.

Figure 9A:
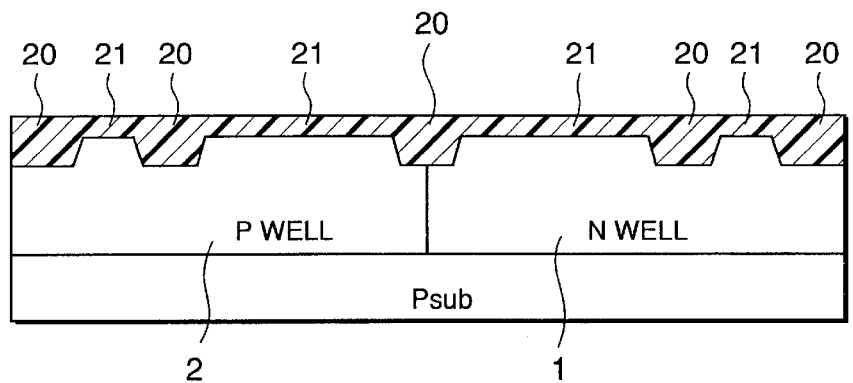
FIGS. 9A to 9C is a process section view of the embodiment 2 according to the invention.

First, as FIG. 9A, after forming a device isolation oxide film 20 of approximate 300 nm in thickness is formed on a P-type substrate using a conventional technology, the N well 1 and the P well 2 are formed by ion implantation. For example, each surface density of the N well 1 and the P well 2 is set at $3 \times 10^{17}$ to $5 \times 10^{17}$ cm$^{-3}$. Moreover, the gate oxide film 21 of approximate 6 nm in thickness is formed by a thermal oxidation method.

Figure 9B:
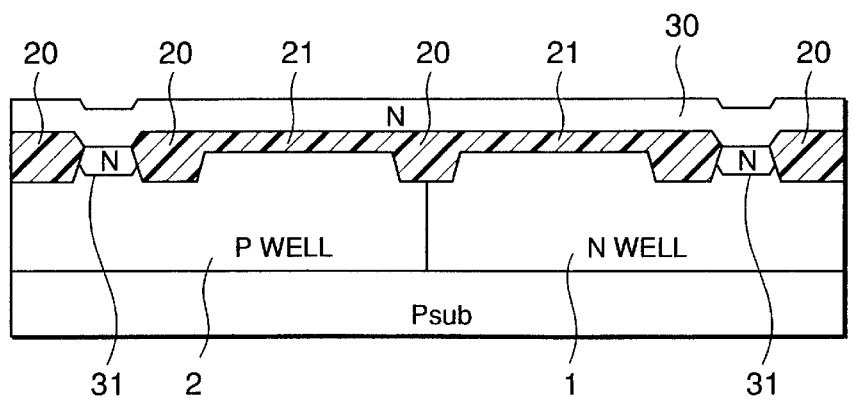

Subsequently, after the gate oxide film of the region of the direct contact 11 and 12 in FIG. 6 is selectively removed by wet etching using a photoresist process, N-type polycrystal silicon 30 of approximate 100 to 150 nm in thickness containing N-type impurity (for example, arsenic) of $10^{18}$ to $10^{19}$ cm$^{-3}$ is grown on the entire surface as shown in FIG. 9B. By supplying of heat during this process, N diffused region 31 is formed from N-type polycrystal silicon 90 by impurity diffusing.

After this processing, patterning and forming of a side wall of N-type polycrystal silicon 30 are performed using a conventional technology to grow a silicon oxide film of approximate 20 nm in thickness on the entire surface (not shown).

Figure 9C:
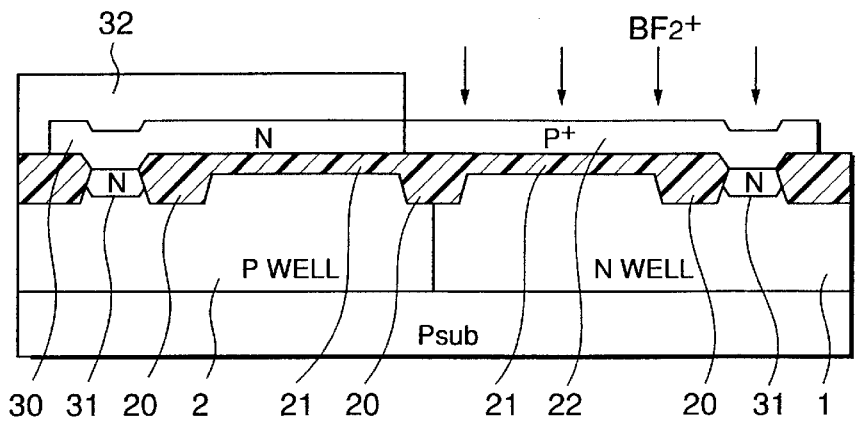

Moreover, as shown in FIG. 9C, source•drain regions of the PMOS transistor and a well contact region of the P well are formed by ion implantation of BF2 using a photoresist 32 as a mask. At ion implantation, for example, the conditions of acceleration voltage of 20 kV and dose of $3 \times 10^{15}$ cm$^{-2}$ are used. At this point of time, the P⁺ polycrystal silicon 22 is formed by performing ion implantation to the region on the gate electrode also as shown in FIG. 9C.

Figure 10A:
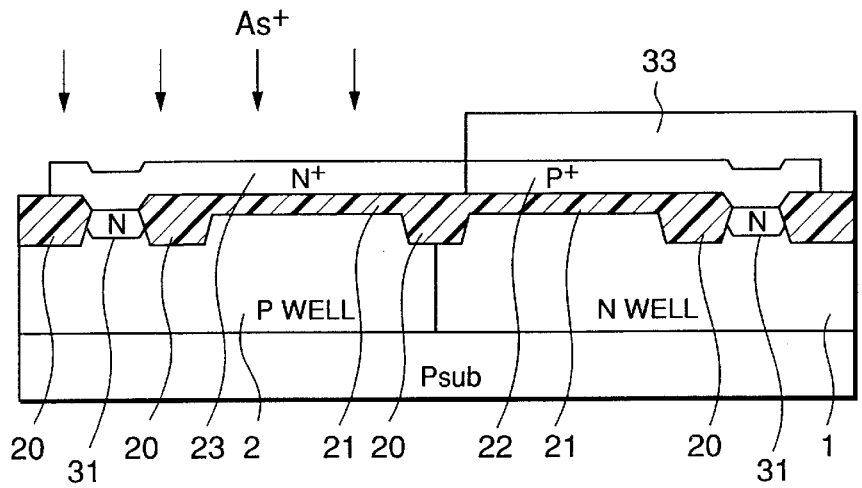
FIGS. 10A to 10B is a process section view of the embodiment 2 according to the invention.

Subsequently, as shown in FIG. 10A, source drain regions of the NMOS transistor and a well contact region of the N well are formed by ion implantation of arsenic using a photoresist 33 as a mask. At ion implantation, for example, the conditions of acceleration voltage of 30 kV and the amount of dose of $3 \times 10^{15}$ cm$^{-2}$ are used. At this point of time, the N⁺ polycrystal silicon 23 is formed by performing ion implantation to the region on the gate electrode also as shown in FIG. 10A.

Figure 10B:
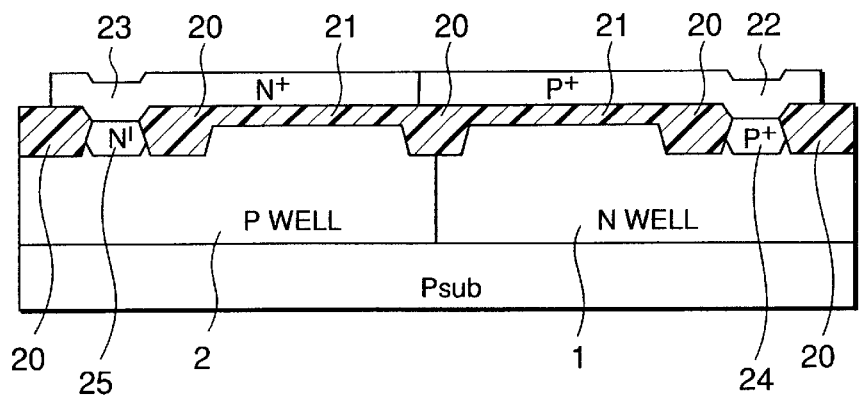

After this processing, as shown in FIG. 10B, lamp anneal is performed under the condition of, for example, 1050° C. and 15 sec. in order to activate the impurity ion-implanted electrically.

At this point of time, the impurity diffuses from N⁺ polycrystal silicon 23 into the P well 2 as well as the impurity diffuses from P⁺ polycrystal silicon 22 into the P well 2, and P⁺ diffused region 24 and N⁺ diffused region 25 are formed (FIG. 10B).

After this processing, the metal silicide is provided on the surface of the silicon and the polycrystal silicon using conventional technology to realize the silicide structure, and then to form an isolation film 27, to perforate the contact, to form the buried electrode 28 on the contact, and to form a first aluminum layer 7 to complete the structure shown in FIG. 8.

As described above, in the embodiment 2, the protective elements are connected at the point of the time that the source•drain of the transistor are formed for all the independent gate electrodes. Therefore, in the manufacturing processes from after the subsequent isolation film forming, all the gate oxide films can be protected from the damages caused by plasma.

Embodiments 3

Figure 11:
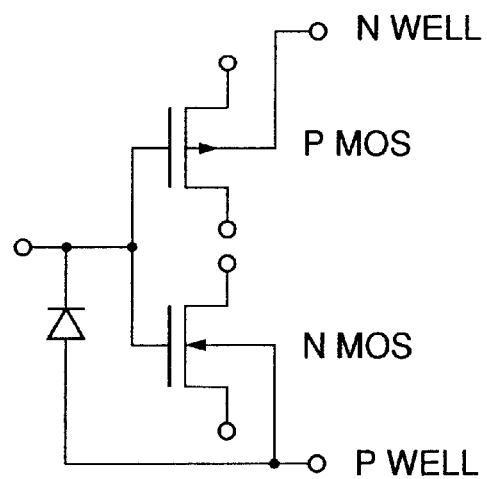
FIG. 11 is an equivalent circuit diagram of an embodiment 3 according to the invention.
Figure 12:
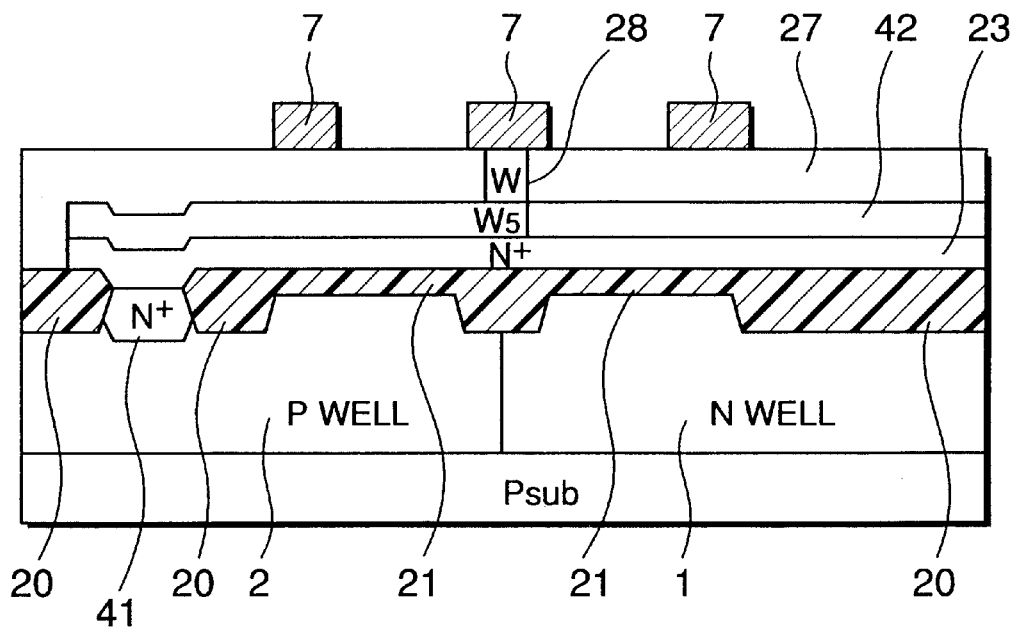
FIG. 12 is a sectional structure view of the embodiment 3 according to the invention.
Figure 13:
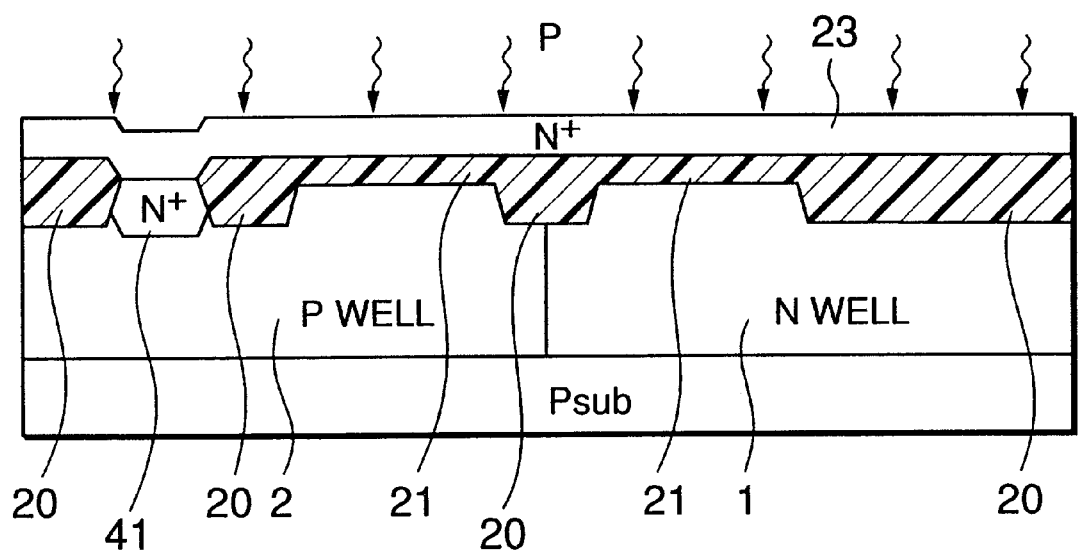
FIG. 13 is a process section view of the embodiment 3 according to the invention.

Referring to FIGS. 11 to 13, description proceeds to the embodiment 3 of this invention.

The embodiment 3 has the structure that the protective elements are connected to the basic cell of the gate array as well as the embodiment 2. FIG. 11 is an equivalent circuit diagram of the basic cell, FIG. 12 is a sectional structure view of the basic cell and FIG. 13 is a drawing showing a manufacturing process of the basic cell.

In the embodiment 3 in contrast to the embodiment 2, the protective elements for the gate oxide film are is constructed by only N$^+$ diffused region 41 formed by diffusing from N$^+$ polycrystal silicon 23 and the PN diode constituted by the P well 2. Moreover, a reference numeral 27 is the isolation film, a reference numeral 28 is an imbedded electrode, and a reference numeral 42 is a W silicide, in FIG. 12.

Since the N$^+$ polycrystal silicon 23 is used for the gate electrode of the PMOS transistor also, it is not required to make the gate electrode of the PMOS transistor the type of P$^+$ at implantation of BF2 ion for formation of the source drain regions of the PMOS transistor. Therefore, the deep N$^+$ diffused region 41 can be formed within the P well 2, as well as phosphor of $10^{20}$ to $10^{21}$ cm$^{-3}$ is added into the polycrystal silicon grown prior to processing of the gate electrode by the thermal diffusion method of approximate 900° C. (FIG. 13).

Moreover, in contrast to the embodiment 2, since the embodiment 3 can include the deep PN junction by a long time heat treatment before the source drain are formed, a junction leak current caused by crystal defects in the junction surroundings of the protective diodes can be reduced. Moreover, the gate oxide film can be protected from the various damages caused by plasma from after process of the gate polycrystal silicon electrode.

Figure 14:
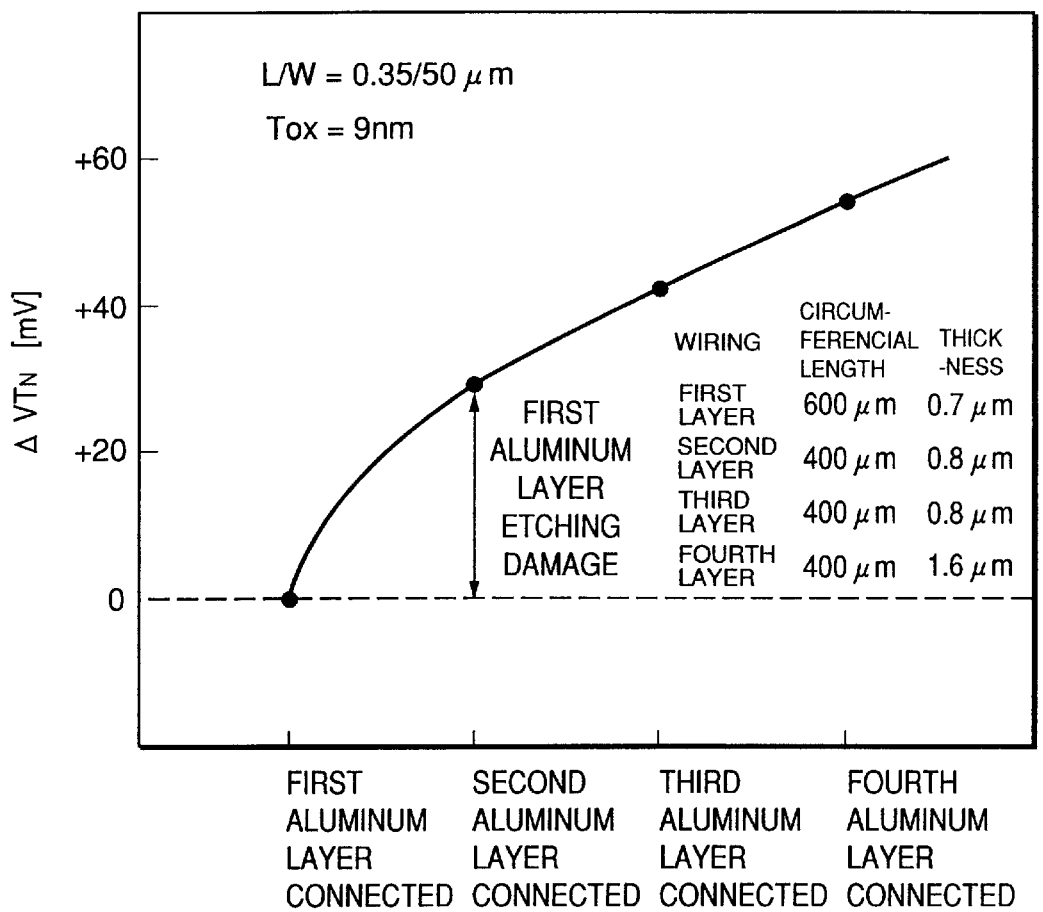
FIG. 14 is a graph illustrating an effect of the invention, and shows a relationship between a connecting wiring layer to a protective device and an amount of fluctuation of threshold voltage.

As described above, the semiconductor device according to the invention comprise the protective elements connected to the independent gate electrode used in the MOS transistor by the wiring layer of the lowest layer. Accordingly, all the gate oxide film can be protected from the electrical damages caused by plasma in the process from after process patterning the wiring layer of the lowest layer. An example of this effect is shown in FIG. 14. In the NMOS transistor in which the first aluminum layer to the fourth aluminum layer are connected to the gate oxide film, a relationship between a connecting wiring from the gate electrode to the protective elements thereof and a threshold voltage (VT).

The threshold voltage (VT) in FIG. 14 are the characteristic after hydrogen processing under the condition of approximate 400° C. and 20 min in order to recover the damage. The damage of which recovery by hydrogen alloy is not completed is accumulated and the threshold voltage (VT) is increasing, as the connecting wiring layer becomes the upper layer, referred to the case connecting to the protective elements through the first aluminum layer. In the previous structure without the protective elements, the threshold voltage (VT) of the NMOS transistor connected to an output of the transistor of the preceding stage from the first aluminum layer with the wiring length of 300 µm through the second aluminum layer increases over 30 mV, as compared to the case connecting through only the first aluminum layer. On the other hand, in the structure according to the present invention wherein the protective elements are connected to all the gate electrode through the wiring layer of the lowest layer, increasing of the threshold voltage (VT) can be prevented.

Moreover, with regard to increase of the gate capacitance in the invention, in the basic cell with the thickness of the gate oxide film of 9 nm, the gate length of 0.35 µm and the gate width of 20 µm, the capacitance increase can be suppressed below 2%.

The semiconductor device having the MOS transistors, said device comprising the protective elements being connected to the independent gate electrode through the wiring layer of the lowest layer. Accordingly, all the gate oxide film can be protected from the electrical damages caused by plasma in the process from after process patterning the wiring layer of the lowest layer. Moreover, the invention can reduce the characteristic variations caused by the electrical damages due to the plasma process.

Moreover, the reliability of the gate oxide film such as the characteristic fluctuation by hot-carrier effect and TDDB characteristic is degraded by the plasma damage. Therefore, in the invention, the degradation of the reliability of the gate oxide film caused by the wiring layout can be prevented.

Furthermore, satisfactory overetching can be already performed without sustaining the damage when arriving at patterning process of the wiring layer and etching process at opening the through hole, whereby the yield is improved. Moreover, the film between wiring layers utilizing a high density plasma source is introduced, whereby planning of planarization is performed easily.

Moreover, the invention can be readily applied to the semiconductor devices of the gate array type, using the gate electrode as the wiring layer of the lowest layer. The protective elements can be connected to the gate electrode prior to opening process of the contact hole by using the PN diodes by a second conduction type well in which a first conduction type MOS transistor is formed and a first conduction type diffused layer region formed by impurity diffusion from said gate electrode within said second conduction type well as the protective elements. Accordingly, the gate oxide films are protected from the plasma damage in the process from after opening of the contact hole.

Since the protective elements are formed directly below a leader gate electrode, increase of the square measure of the cell is lees, and the constraints relating to the wiring layout is less. With regard to increase of the gate capacitance, for example, in the basic cell with the thickness of the gate oxide film of 9 nm, the gate length of 0.35 µm and the gate width of 20 µm, the capacitance increase can be suppressed below 2%, whereby it can be said that the influence thereof is very little.

What is claimed is:

1. A semiconductor device having an MOS transistor, said device comprising:
   a gate electrode;
   a wiring layer of a lowest layer with respect to said gate electrode; and
   a protective element connected to said gate electrode via said wiring layer of the lowest layer,
   wherein said wiring layer is separate and distinct from the gate electrode,
   wherein in a case of a positive surge voltage, said positive surge voltage is relieved to a first potential side by a forward diode operation of said protective element, or in a case of a negative surge voltage, said negative surge voltage is relieved to a second potential side by the forward diode operation of said protective element, and
   wherein said diode is formed by impurity diffusion from a wiring layer that is the same level layer as the gate electrode.

2. A semiconductor device as claimed in claim, 1, wherein said protective element is composed of a PN diode; said PN diode comprising:

a second conduction type well in which a first conduction type MOS transistor is formed; and a first conduction type diffused layer region formed within said second conduction type well.

3. A semiconductor device as claimed in claim 1, wherein said protective element is formed in only one of a first and a second conduction type region.

4. A semiconductor device as claimed in claim 1, wherein said wiring layer is composed of aluminum.

5. A semiconductor device comprising:

a substrate;

a plurality of MOS transistors formed on said substrate, said MOS transistors having respective source-drain regions and respective gate electrodes;

a first wiring layer connected to at least one of said sources-drain regions and at least one of said gate electrodes, said first wiring layer being the lowest, with respect to said gate electrodes, of a plurality of wiring layers formed on said substrate; and at least one electrical surge-protective element formed on said substrate in a region other than said source-drain regions;

wherein said first wiring layer connects said at least one gate electrode to said electrical surge-protective element, and said first wiring layer is separate and distinct from said gate electrodes, wherein in a case of a positive surge voltage, said positive surge voltage is relieved to a first potential side by a forward diode operation of said at least one electrical surge-protective element, or in a case of a negative surge voltage, said negative surge voltage is relieved to a second potential side by the forward diode operation of said at least one electrical surge-protective element, and wherein said diode is formed by impurity diffusion from said wiring layer that is the same level layer as the gate electrode.

6. A semiconductor device as claimed in claim 1, wherein said second potential side is ground and said first potential side is not ground.

7. A semiconductor device as claimed in claim 5, wherein said second potential side is ground and said first potential side is not ground.

8. A semiconductor device as claimed in claim 1, wherein said protective element comprises at least one of:

a P-N diode whose anode is connected to said gate electrode, and whose cathode is connected to said first potential side; and a N-P diode whose cathode is connected to said gate electrode, and whose anode is connected to said first potential side.

9. A semiconductor device as claimed in claim 5, wherein said protective element comprises at least one of:

a P-N diode whose anode is connected to at least one of said gate electrodes, and whose cathode is connected to said first potential side; and a N-P diode whose cathode is connected to said gate electrode, and whose anode is connected to said second potential side.

* * * * *

UNITED STATES PATENT AND TRADEMARK OFFICE
CERTIFICATE OF CORRECTION

PATENT NO. : 6,410,964 B1
DATED : June 25, 2002
INVENTOR(S) : Akira Shida

It is certified that error appears in the above-identified patent and that said Letters Patent is hereby corrected as shown below:

Column 5,
Line 44, delete "layer." insert -- layer --;
Line 59, delete "26" insert -- 25 --;
Line 60, delete "28" insert -- 23 --.

Column 6,
Line 21, delete "90" insert -- 30 --.

Column 7,
Line 11, delete "is";
Lines 20-21, delete "source drain" insert -- source·drain --;
Line 29, delete "source drain" insert -- source·drain --;
Line 49, delete "C." insert -- C --.

Column 8,
Line 38, delete "lees" insert -- less --.

Signed and Sealed this

Nineteenth Day of November, 2002

*Attest:*

*Attesting Officer*

JAMES E. ROGAN
*Director of the United States Patent and Trademark Office*